US011513976B2

(12) United States Patent
Vaysman et al.

(10) Patent No.: US 11,513,976 B2
(45) Date of Patent: Nov. 29, 2022

(54) ADVANCED CE ENCODING FOR BUS MULTIPLEXER GRID FOR SSD

(71) Applicant: Western Digital Technologies, Inc., San Jose, CA (US)

(72) Inventors: Dmitry Vaysman, San Jose, CA (US); Hanan Borukhov, Rehovot (IL); Leonid Minz, Beer Sheva (IL); Ron Tsechanski, Lehavim (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/836,730

(22) Filed: Mar. 31, 2020

(65) Prior Publication Data

US 2021/0303484 A1     Sep. 30, 2021

(51) Int. Cl.
*G06F 13/42*     (2006.01)
*G06F 13/16*     (2006.01)

(52) U.S. Cl.
CPC ...... *G06F 13/1668* (2013.01); *G06F 13/4282* (2013.01); *G06F 2213/0026* (2013.01)

(58) Field of Classification Search
CPC ............. G06F 13/1668; G06F 13/4282; G06F 2213/0026
See application file for complete search history.

(56) References Cited

U.S. PATENT DOCUMENTS

| | | | |
|---|---|---|---|
| 5,822,251 A | 10/1998 | Bruce et al. | |
| 7,949,844 B2 | 5/2011 | Imondi et al. | |
| 7,957,173 B2 * | 6/2011 | Kim | G11C 5/02 365/51 |
| 9,214,211 B2 | 12/2015 | Chan | |
| 9,245,590 B2 | 1/2016 | Chen et al. | |
| 9,431,078 B2 * | 8/2016 | Takeyama | G06F 13/1668 |

(Continued)

FOREIGN PATENT DOCUMENTS

| | | |
|---|---|---|
| JP | 2006172467 A | 6/2006 |
| KR | 100341180 B1 | 11/2002 |

(Continued)

OTHER PUBLICATIONS

Gillingham, Peter et al., "800 MB/s DDR NAND Flash Memory Multi-Chip Package With Source-Synchronous Interface for Point-to-Point Ring Topplogy" IEEE Access, vol. 1, 2013, pp. 811-816.

*Primary Examiner* — Henry Tsai
*Assistant Examiner* — Harry Z Wang
(74) *Attorney, Agent, or Firm* — Patterson & Sheridan, LLP; Steven H. VerSteeg

(57) ABSTRACT

The present disclosure generally relates to a method and device for accessing more dies per channel in a data storage device. Each flash interface module (FIM) can have any number of bus multiplexers coupled thereto, and each bus multiplexer can have any number of memory devices coupled thereto. The bus multiplexers can be connected in series or in parallel to the FIM. The individual bus multiplexers can be addressed by a chip enable (CE) command that identifies the specific bus multiplexer as well as the specific memory device of the specific bus multiplexer. The information in the CE command allows more dies per channel without creating signal interference (SI) or limiting transmission performance.

19 Claims, 8 Drawing Sheets

(56) References Cited

U.S. PATENT DOCUMENTS

| | | | |
|---|---|---|---|
| 2004/0230718 A1* | 11/2004 | Polzin | G06F 13/4243 710/22 |
| 2005/0268025 A1* | 12/2005 | Smith | G11C 16/10 711/103 |
| 2007/0245061 A1 | 10/2007 | Harriman | |
| 2009/0238001 A1* | 9/2009 | Redaelli | G11C 7/10 365/185.17 |
| 2011/0093647 A1* | 4/2011 | Lai | G06F 13/1668 711/E12.008 |
| 2014/0189201 A1 | 7/2014 | Dhakshinamurthy et al. | |
| 2015/0106555 A1* | 4/2015 | Ishikawa | G06F 13/16 711/103 |
| 2015/0227484 A1* | 8/2015 | Law | G06F 13/1668 710/300 |
| 2018/0039583 A1* | 2/2018 | Kodera | G11C 7/1075 |
| 2021/0073101 A1* | 3/2021 | Niimura | G06F 11/3055 |

FOREIGN PATENT DOCUMENTS

| | | |
|---|---|---|
| KR | 101626702 B1 | 6/2016 |
| KR | 20160104641 A | 9/2016 |
| KR | 20200039012 A | 4/2020 |
| WO | 2019070413 A1 | 4/2019 |

\* cited by examiner

ADVANCED CE ENCODING FOR BUS MULTIPLEXER GRID FOR SSD

BACKGROUND OF THE DISCLOSURE

Field of the Disclosure

Embodiments of the present disclosure generally relate to a method and device for accessing more dies per channel in a data storage device.

Description of the Related Art

When scaling up client SSD architecture to entry level enterprise architectures, there is an issue with supporting high capacity configurations. Specifically, there is an issue with NAND selection and high capacitance loads due to multiple dies in parallel resulting in signal integrity issues.

In regards to NAND selection, a typical high end controller has 8 NAND channels, known as flash interface modules (FIMs). Each FIM has two chip enable pins (CEs), which allow selection of two NAND groups. Due to space limitations, there is a maximum capacity of dies such as eight dies. With increasing demand for higher capacity, controllers should support more dies per FIM. However, the application specific integrated circuit (ASIC) is limited with 2 CEs.

In regards to capacitance load, in order to support a required host performance, the transmission speed should be taken to the limit. Due to signal integrity (SI) problems, the maximum number of dies "connected" to the channel cannot exceed a certain number of dies, such as eight dies. In some cases, even fewer dies can create a significant SI problem and limit transmission performance.

Therefore, there is a need in the art for accessing more dies per channel in a data storage device while maintaining SI and not limiting transmission performance.

SUMMARY OF THE DISCLOSURE

The present disclosure generally relates to a method and device for accessing more dies per channel in a data storage device. Each flash interface module (FIM) can have any number of bus multiplexers coupled thereto, and each bus multiplexer can have any number of memory devices coupled thereto. The bus multiplexers can be connected in series or in parallel to the FIM. The individual bus multiplexers can be addressed by a chip enable (CE) command that identifies the specific bus multiplexer as well as the specific memory device of the specific bus multiplexer. The information in the CE command allows more dies per channel without creating signal interference (SI) or limiting transmission performance.

In one embodiment, a data storage device comprises: a plurality of memory devices; a plurality of bus multiplexers, wherein each bus multiplexer is coupled to one or more memory devices of the plurality of memory devices; and a flash interface module coupled to the plurality of bus multiplexers; and a controller coupled to the flash interface module, wherein the controller is configured to: send a chip enable command through the flash interface controller, wherein the chip enable command includes a bus multiplexer identifier and a memory device identifier.

In another embodiment, a data storage device comprises: a controller; a plurality of flash interface modules coupled to the controller; a plurality of bus multiplexers coupled to at least a first flash interface module of the plurality of flash interface modules; and a plurality of memory devices coupled to a first bus multiplexer of the plurality of bus multiplexers, wherein the controller is configured to: send a first signal to the first flash interface module; send a second signal to the first flash interface module, wherein the second signal is lower than the first flash signal; and send a command signal to the first flash interface module, wherein the first signal, second signal, and command signals are distinct.

In another embodiment, a data storage device comprises: a plurality of memory devices; a plurality of bus multiplexers, wherein each bus multiplexer is coupled to at least one memory device of the plurality of memory devices; a flash interface module coupled to the plurality of bus multiplexers; and means to deliver a chip enable command signal to a first memory device of the plurality of memory devices, wherein the chip enable command signal includes a bus multiplexer identifier and a memory device identifier.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a method and device for accessing more dies per channel in a data storage device. Each flash interface module (FIM) can have any number of bus multiplexers coupled thereto, and each bus multiplexer can have any number of memory devices coupled thereto. The bus multiplexers can be connected in series or in parallel to the FIM. The individual bus multiplexers can be addressed by a chip enable (CE) command that identifies the specific bus multiplexer as well as the specific memory device of the specific bus multiplexer. The information in the CE command allows more dies per channel without creating signal interference (SI) or limiting transmission performance.

Figure 1:
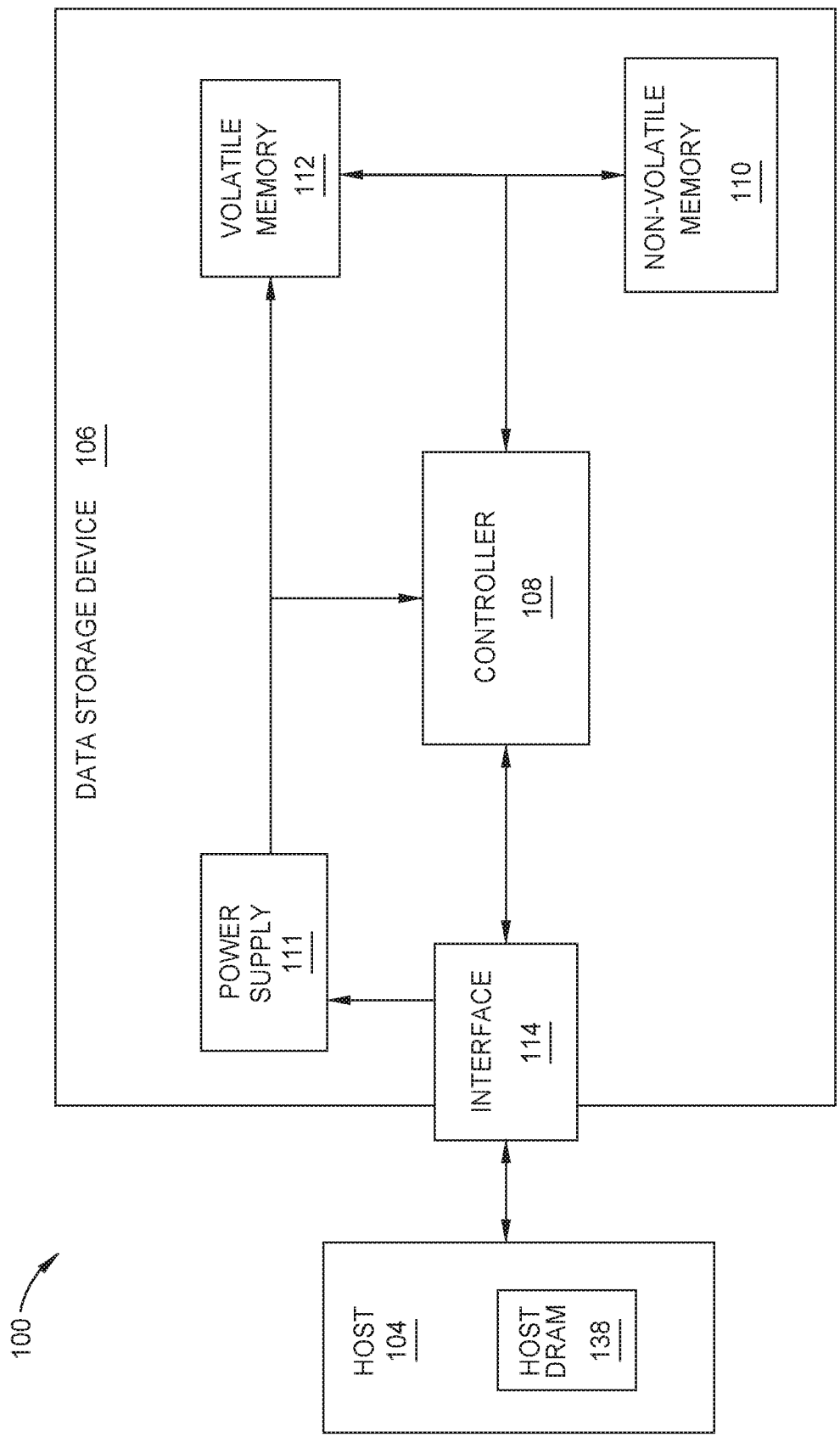
FIG. 1 is a schematic block diagram illustrating a storage system in which storage device may function as a storage device for a host device, in accordance with one or more techniques of this disclosure.

FIG. 1 is a schematic block diagram illustrating a storage system 100 in which data storage device 106 may function as a storage device for a host device 104, in accordance with one or more techniques of this disclosure. For instance, the host device 104 may utilize non-volatile memory 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The storage system 100 includes a host device 104 which may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

The data storage device 106 includes a controller 108, non-volatile memory 110 (NVM 110), a power supply 111, volatile memory 112, and an interface 114. The controller 108 comprises an internal memory or buffer (not shown). In some examples, the data storage device 106 may include additional components not shown in FIG. 1 for sake of clarity. For example, the data storage device 106 may include a printed board (PB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The data storage device 106 includes NVM 110, which may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. Flash memory devices may include NAND or NOR based flash memory devices, and may store data based on a charge contained in a floating gate of a transistor for each flash memory cell. In NAND flash memory devices, the flash memory device may be divided into a plurality of blocks which may be divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines. Furthermore, NAND flash memory devices may be 2D or 3D devices, and may be single level cell (SLC), multi-level cell (MLC), triple level cell (TLC), or quad level cell (QLC). The controller 108 may write data to and read data from NAND flash memory devices at the page level and erase data from NAND flash memory devices at the block level.

The data storage device 106 includes a power supply 111, which may provide power to one or more components of the data storage device 106. When operating in a standard mode, the power supply 111 may provide power to the one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may be comprised of one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory before sending the data to the NVM 110. The controller 108 may also comprise of eight NAND channels, which each NAND channel may be considered a flash interface module (FIM) (not shown). The number of NAND channels listed is not intending to be limiting, and the controller 108 may comprise of more than or less than number of NAND channels listed.

Figure 2:
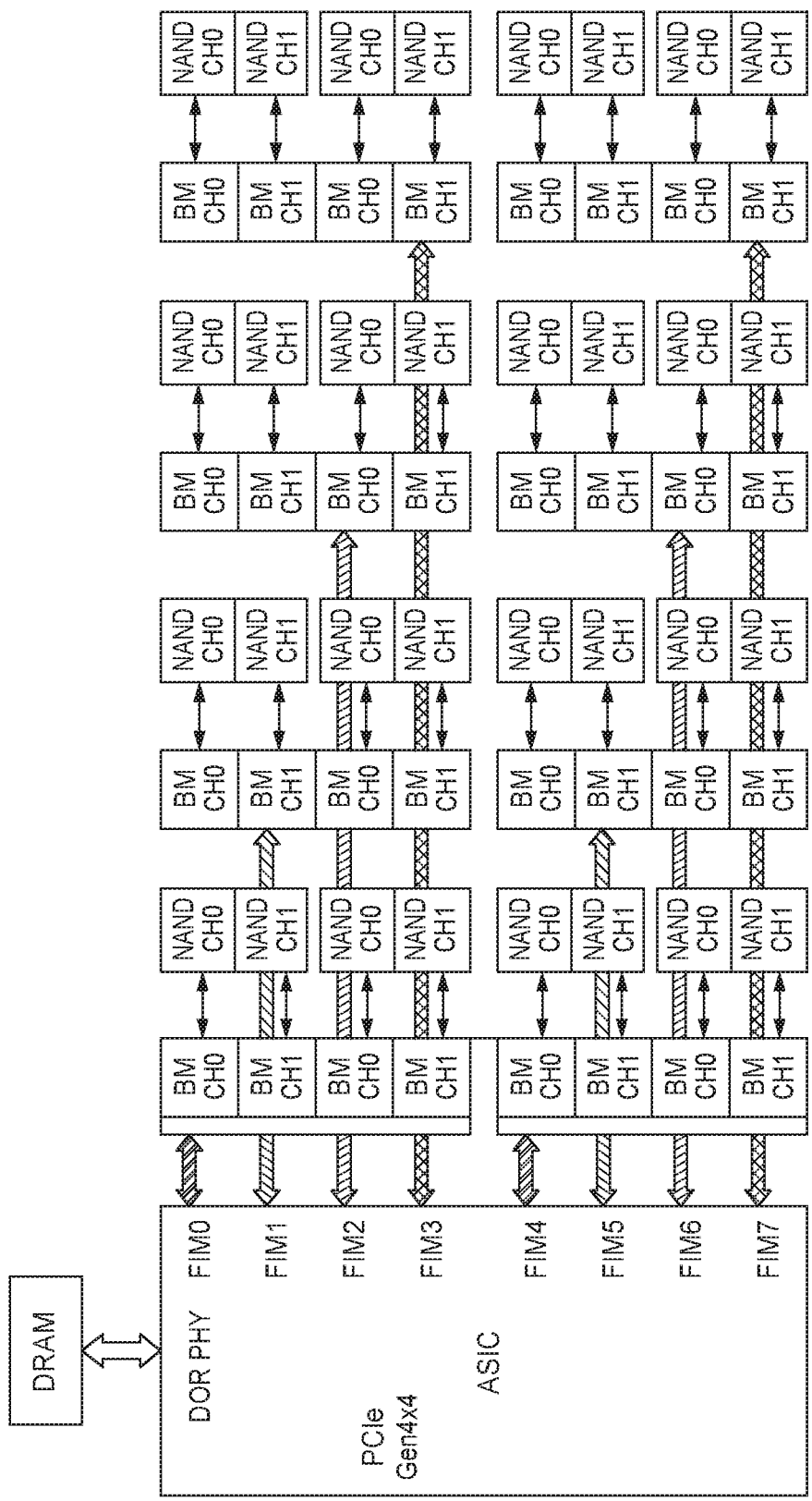
FIG. 2 is a schematic illustration of a standard solution to maximize FIM capacity according to one embodiment.

FIG. 2 is a schematic illustration of a standard solution to maximize FIM capacity according to one embodiment. Each FIM has two chip enable (CE) pins. Each CE pin is associated with a NAND group. The maximum NAND group capacity may be eight dies. Therefore, a FIM may have a total of 2 dies, where 8 FIMs have a total of 16 dies. The maximum value listed is not intended to be limiting, and other embodiments exist. In order to increase the capacity of the memory device, the controller, such as the controller 108 of FIG. 1, needs to support more dies per FIM. However, the increased die per FIM may cause a high capacitance load that may decrease the reliability of the memory device. Furthermore, the high capacitance load may cause a decrease in signal integrity (SI) and limit TM performance. However, by including a bus multiplexer (BM) that splits a single channel into four sub-channels, the high capacitance load may be addressed. The bus multiplexer splits the total amount of dies per channel to the sub-channels.

The data storage device, such as the data storage device 106 of FIG. 1, may comprise of a controller, such as the controller 108 of FIG. 1, coupled to an application-specific integrated circuit (ASIC). The ASIC may comprise the flash interface modules and communicate with the DRAM. By encoding the CE of the ASIC, each sub-channel in the ASIC may be selected. The CE is an input that, when true, permits active operation including I/O of data and, when false, prevents active operation and causes the memory to be in a reduced power standby mode with the outputs floating. By incorporating the CE with the ASIC, the high capacitance load is decreased allowing for better reliability with greater memory capacity.

FIG. 2 depicts an ASIC that comprises eight FIMs, denoted by FIM0-FIM7. Each FIM is associated with a BM that splits each channel into four sub-channels. Each sub-channel is associated with a NAND group which may comprise of one or more NAND dies. However, since the ASIC is limited to two CEs, the sub-channels are grouped into groups of two. For example, FIM0 is associated with the following sub-channels: CH0 and CH1. By incorporating the BM, the maximum die capacity is 8 FIM*4 die/FIM=32 dies. Furthermore, a bus multiplex architecture may allow an eight FIM system to contain more than 32 dies, such as 1024 dies.

Figure 3:
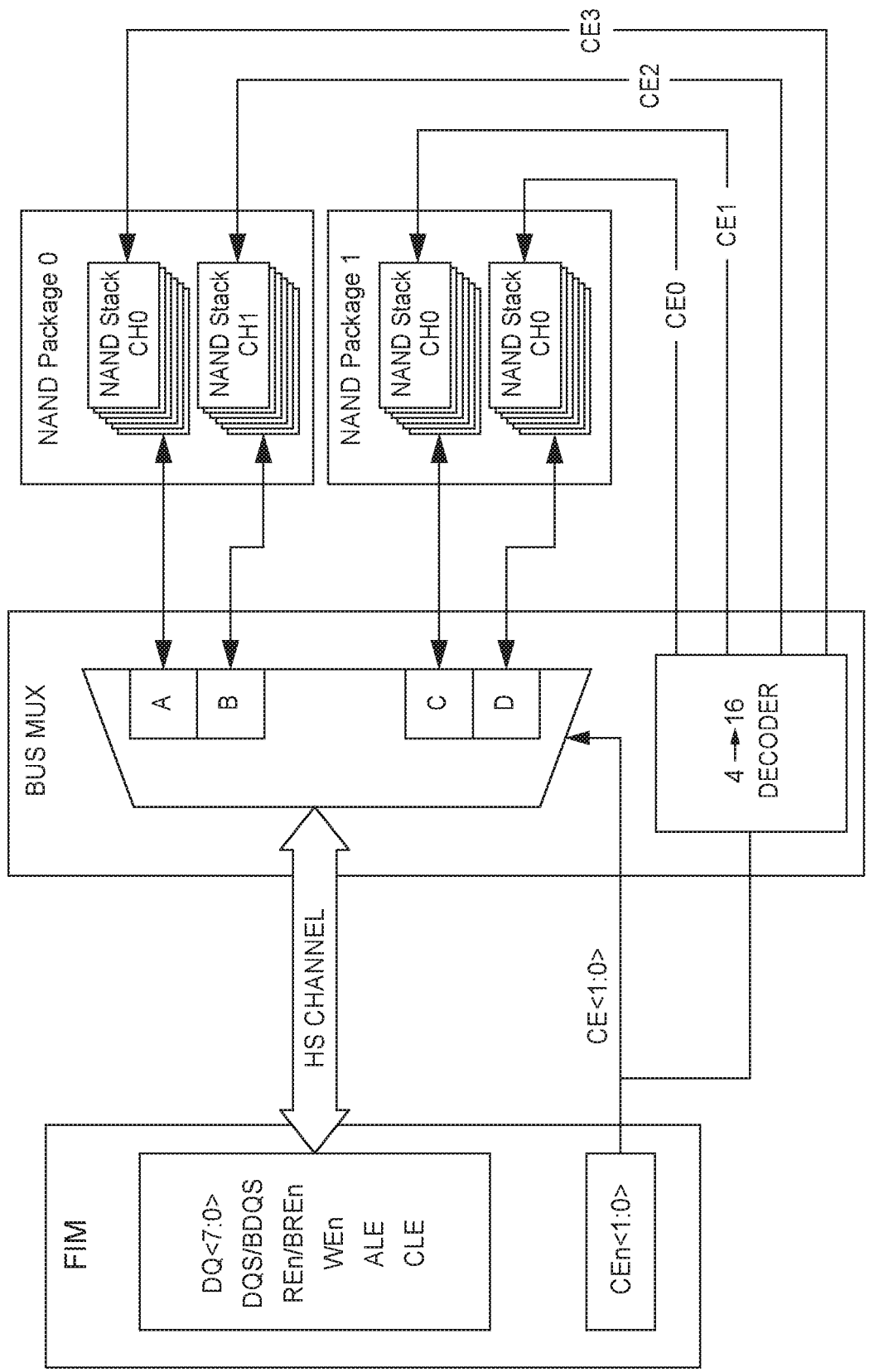
FIG. 3 is a schematic illustration of a standard system showing the connection between FIM and memory device.

FIG. 3 is a schematic illustration of a standard system showing the connection between FIM and memory device. The memory device may be the non-volatile memory of FIG. 1 and may comprise NAND packages. Each NAND package is comprised of a NAND stack and each NAND stack is associated with a CE pin. In order to determine the correct NAND stack a read or write is referencing, the CE control must be decoded. The CEn<1:0> is a 2 bit signal that corresponds to the two CE pins per FIM available. The Table below describes an example of a CE control to NAND group decoding.

TABLE

| ASIC FIMx | | Bus Mux | NAND Package1 | | NAND Package0 | | Data |
|---|---|---|---|---|---|---|---|
| CEn1 | CEn0 | BM0 | CEn0 | CEn1 | CEn2 | CEn3 | FIMx |
| 0 | 0 | A | 0 | 1 | 1 | 1 | NAND GR0 |
| 0 | 1 | B | 1 | 0 | 1 | 1 | NAND GR1 |
| 1 | 0 | C | 1 | 1 | 0 | 1 | NAND GR2 |
| 1 | 1 | D | 1 | 1 | 1 | 0 | NAND GR3 |

The FIM architecture utilizes a 16 bit signal to communicate with the bus multiplexer to determine the location in the NAND of the read or write command. The signals travel along a high-speed channel from the FIM to the BM. Since BM is limited by two chip enables, four sub-channels exist due to four unique combinations of two bit signals. Furthermore, a line decoder takes n-digit binary number and decodes it into 2^n data lines. The decoder in the BM is a 4 to 16 data line decoder in which each of the four CE controls are associated with 4 bits each, allowing for a total of 16 different data bits combinations. A group of 4 data bits are associated with a NAND group, such as NAND GR0 is associated with CEn0 (0), CEn1 (1), CEn2 (1), and CEn3 (1) as shown in the table above. Furthermore, to achieve the data bits, the ASIC FIMx is associated with a 2 bit signal that corresponds with a BM. For example, an ASIC FIMx of CEn1 (0) and CEn0 (0) corresponds with a BM of A. The BM of A corresponds with the NAND GR0 because the bit data from the decoder corresponds to the NAND Package1 bits, CEn0 (0) and CEn1 (1), and NAND Package 2, CEn2 (1), and CEn3 (1).

Figure 4:
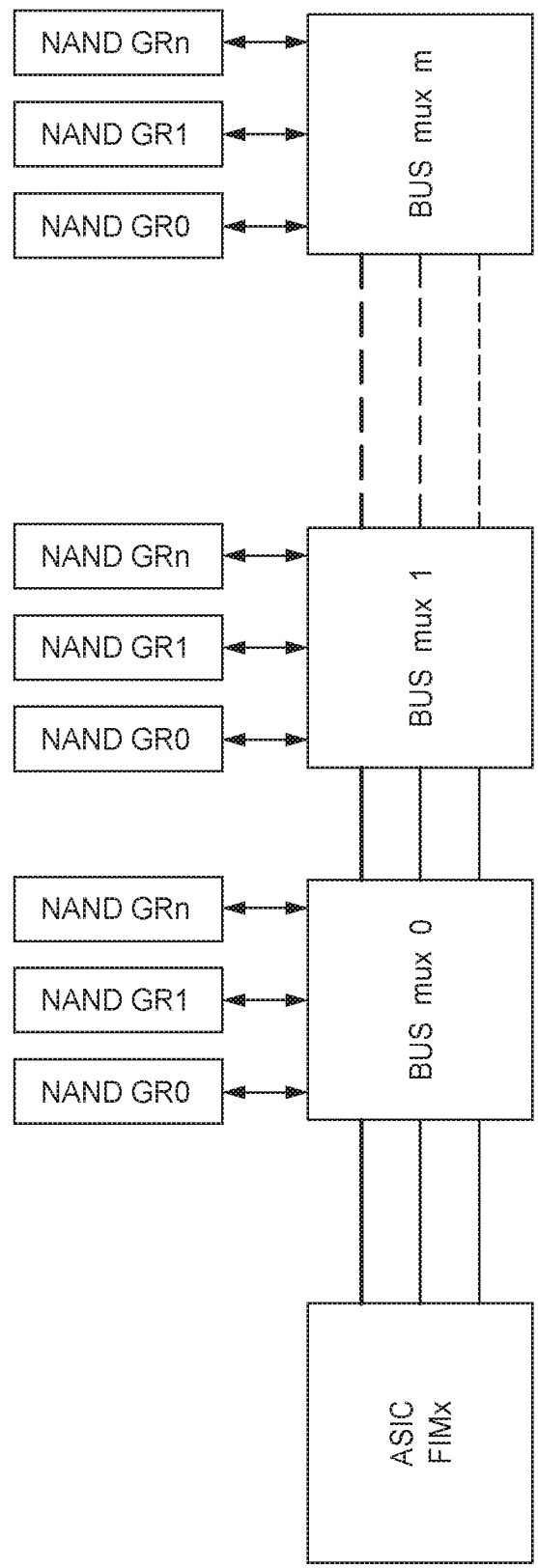
FIG. 4 is a schematic illustration of a solution to maximize FIM capacity according to one embodiment.

FIG. 4 is a schematic illustration of a solution to maximize FIM capacity according to one embodiment. In order to access more dies per channel and have the option to scale test and maintenance (TM) bus architecture for performance or capacity, the BMs are connected in parallel or in series to the same FIM. Each BM has the ability to have n-number of sub-channels. Furthermore, the ASIC FIMx may have m-number of BMs. Likewise, there may be x-number of ASIC FIMs. The CE architecture allows for multiple BMs to be in series without a high capacitance load issue. The CE selects the particular BM to be utilized for data transfer while the remaining BMs are in idle or a low power mode.

Furthermore, each n-number of sub-channels are NAND groups. A NAND group may be scaled for capacity, where it may comprise, but limited to, of about 8 NAND dies. If a NAND group is scaled for performance, then the NAND group may comprise, but not limited to, of about 2 NAND dies. For both NAND groups scaled to capacity and NAND groups scaled for performance, a configuration of a single CE may be needed. The single CE may have the ability to select up to, but not limited to, about 1024 dies per channel.

Figure 5:
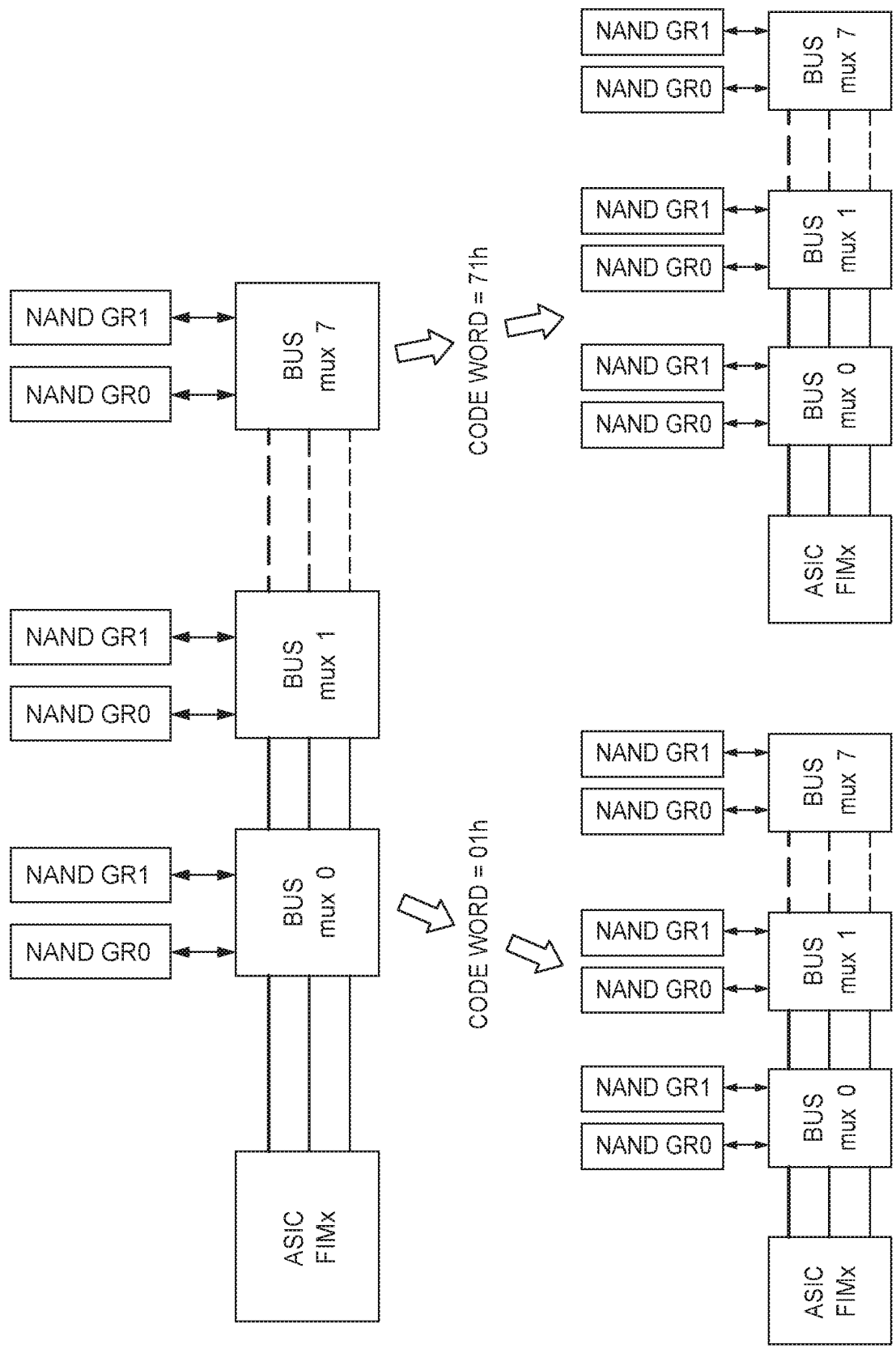
FIG. 5 is a schematic illustration of the implementation FIG. 4.

FIG. 5 is a schematic illustration of the implementation FIG. 4. In order to select a particular sub-channel for a read or write command, the FIMx sends a unique command "CE Command" that corresponds with an encoded BM identifier and a NAND group identifier. The combination of the identifiers are constructed of data bits within each BM in series. The size of the "CE command" may be about 8 bits. The size of the "CE command" is not intended to be limiting. The "CE Command" is a code word such as "01h".

The first digit from a first signal corresponds to the BM identifier, where "0" is associated with BUS mux 0. The second digit from a second signal corresponds with the NAND group number, where "1" is associated with NAND GR1. In this example, the number of sub-channels is 2 (i.e., n=2) which corresponds to two NAND groups, NAND GR0 and NAND GR1. Furthermore, the number of BMs is 8 (i.e., m=8).

Furthermore, the code word is "71h" refers to BM7 (i.e., the eighth BM in the sequence), and NAND GR1. When the CE command is sent from the ASIC FIMx, the non-relevant BMs ignore the command. The CE command is passed from BM to BM such that a command travels sequentially to the target BM and NAND group.

Each BM is assigned an ID or code word statically or upon discovery, which may be when the system is powered-up. One benefit of the command ID or code word may be that the ID or code word is compatible or native to the FIM process of interfacing with the NAND. The compatibility may be utilized for a standard NAND device due to the "CE command". Furthermore, the compatibility may allow flexibility of hardware and firmware design across many capacity points with or without BM. When the "CE command" is received by the respective BM and NAND group, the relevant data is selected and the other NAND groups and BMs are in an idle state.

Figure 6:
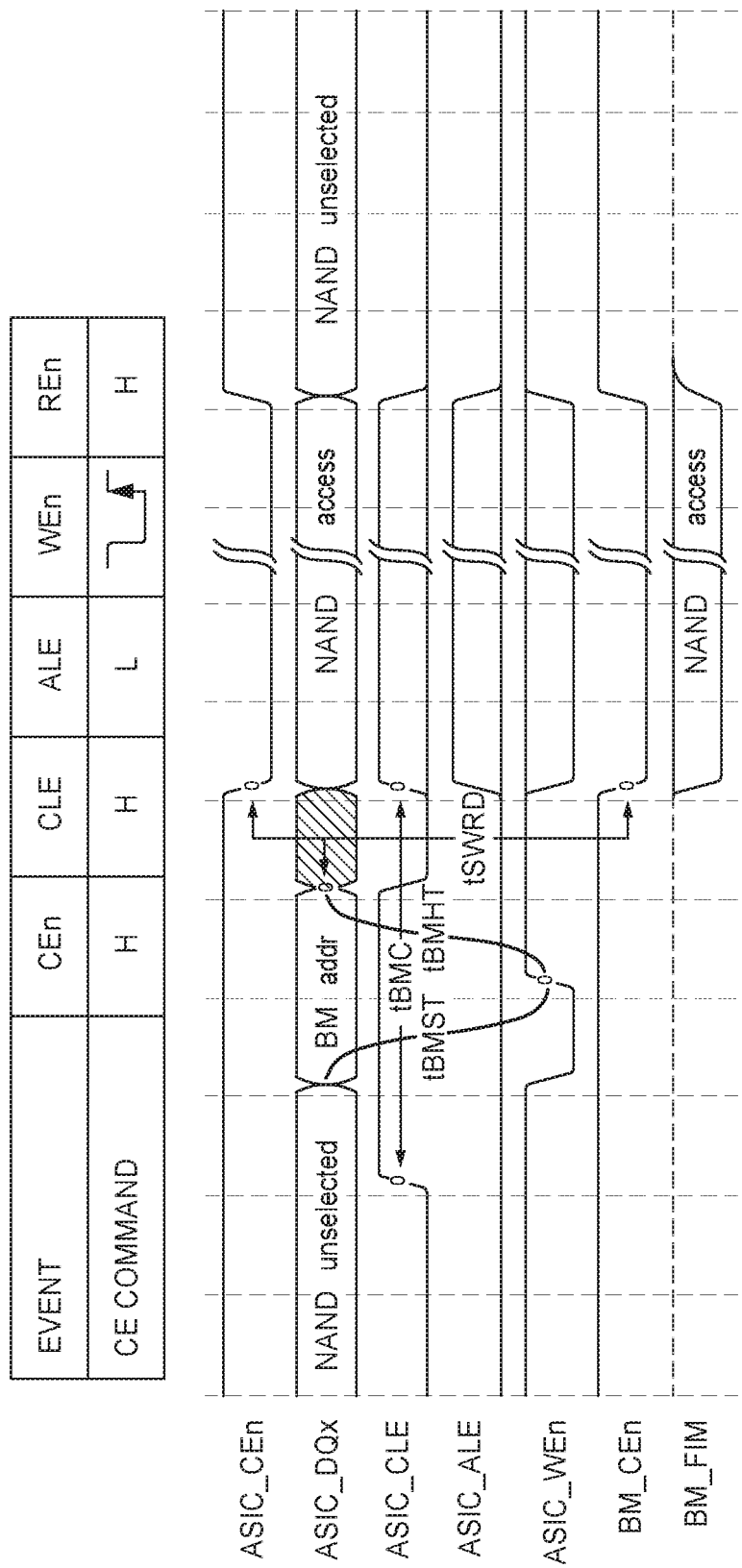
FIG. 6 is a graph illustrating the command state diagram and timing for a high signal.

FIG. 6 is a graph illustrating the command state diagram and timing for a high signal. The high signal corresponds with the BM address. The high signal is associated with the BM address so that the signal may not refer to multiple processes, such as when the NAND shares the same data bus or the firmware and/or hardware is used in multiple capacity configurations with or without the BM.

Furthermore, the NAND location is unselected when the CE command is first received. The end of the timeframe for "NAND unselected" is determined by the first falling edge of the ASIC_WEn (i.e., when the ASIC_WEn goes low). The start of the timeframe of the BM address search is indicated when ASIC_CLE goes low and the ASIC_CEn signal is a high, disabling NAND access. During this timeframe, the ASIC_CLE signal is also high. The high ASIC_CEn signal corresponds with a BM address dependent on a first signal (i.e., signal strength determines BM address). The BM address may be the "7" of the code word "71h" of FIG. 5. The "7" refers to the eighth BM, which is the "BUS mux 7" of FIG. 5. The end of the BM address search is indicated by a falling edge of the ASIC_CLE.

The NAND access data line is initiated when ASIC_CEn goes low and terminated when the ASIC_CEn goes high. Furthermore, the strength of the ASIC_CEn1 signal may indicate which NAND group to access. The NAND access is denoted by the second numeral in the code word or CE command. For example, the NAND group location may be the "1" of the code word "71h" of FIG. 5. The "1" refers to the second NAND group, which is the "NAND GR1" of FIG. 5. Multiple NAND addresses may be accessed during the NAND access timeframe by utilizing additional address cycles within the NAND commands.

After a read or write command to the NAND location is completed, the ASIC_CEn goes high. The NAND is unselected during this timeframe since ASIC_CLE is low, ASIC_CEn is high, and ASIC_WEn is high. Other combinations of signals not listed may be applicable to the read or write command for a high CEn signal.

Figure 7:
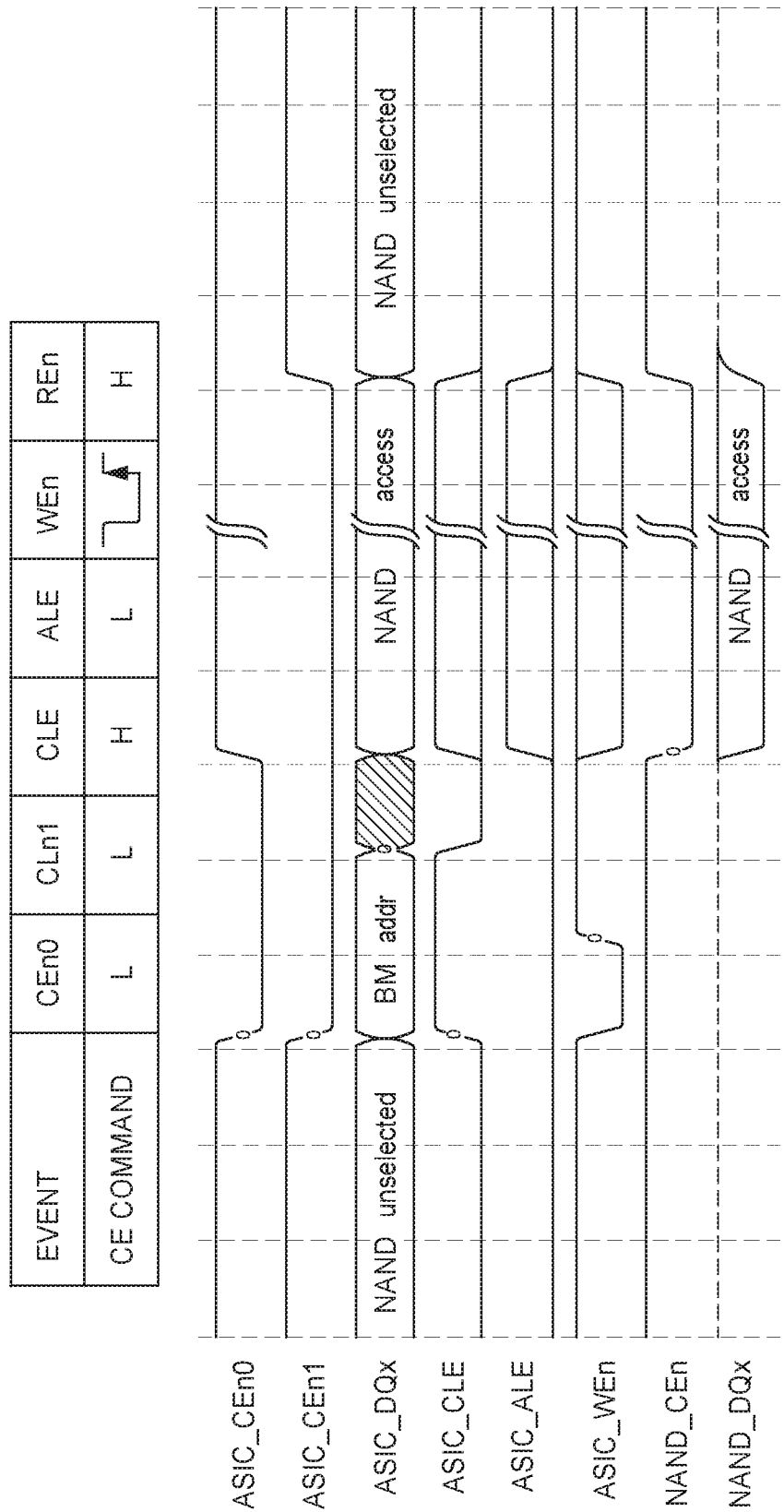
FIG. 7 is a graph illustrating the command state diagram and timing for a low signal.

FIG. 7 is a graph illustrating the command state diagram and timing for a low signal. The low CEn signal corresponds with the NAND group address. The NAND location is unselected when the CE command is first received. When the ASIC_CEn0, ASIC_CEn1, and ASIC_WEn goes low and the ASIC_CLE goes high, the FIMx is accessing the BM address. The high ASIC_CLE signal and the low ASIC_WEn signal may indicate that the BM address can be accessed. The ASIC_CEn signal corresponds with a BM address dependent on a first signal (i.e., signal strength determines BM address). The BM address may be the "7" of the code word "71h" of FIG. 5. The "7" refers to the eighth BM, which is the "BUS mux 7" of FIG. 5.

Furthermore, the end of the BM address timeframe is denoted by the ASIC_CLE falling edge. When the NAND access is addressed, the ASIC_CEn1 is low. Furthermore, the strength of the ASIC_CEn1 signal may indicate which NAND group to access. The NAND access is denoted by the second numeral in the code word or CE command. For example, the NAND group location may be the "1" of the code word "71h" of FIG. 5. The "1" refers to the second NAND group, which is the "NAND GR1" of FIG. 5. Multiple NAND addresses may be accessed during the NAND access timeframe by utilizing additional address cycles within the NAND commands.

After a read or write command to the NAND location is completed, the ASIC_CEn goes high. The NAND is unselected during this timeframe since ASIC_CLE is low, ASIC_CEn is high, and ASIC_WEn is high. Other combinations of signals not listed may be applicable to the read or write command for a low CEn signal.

Figure 8:
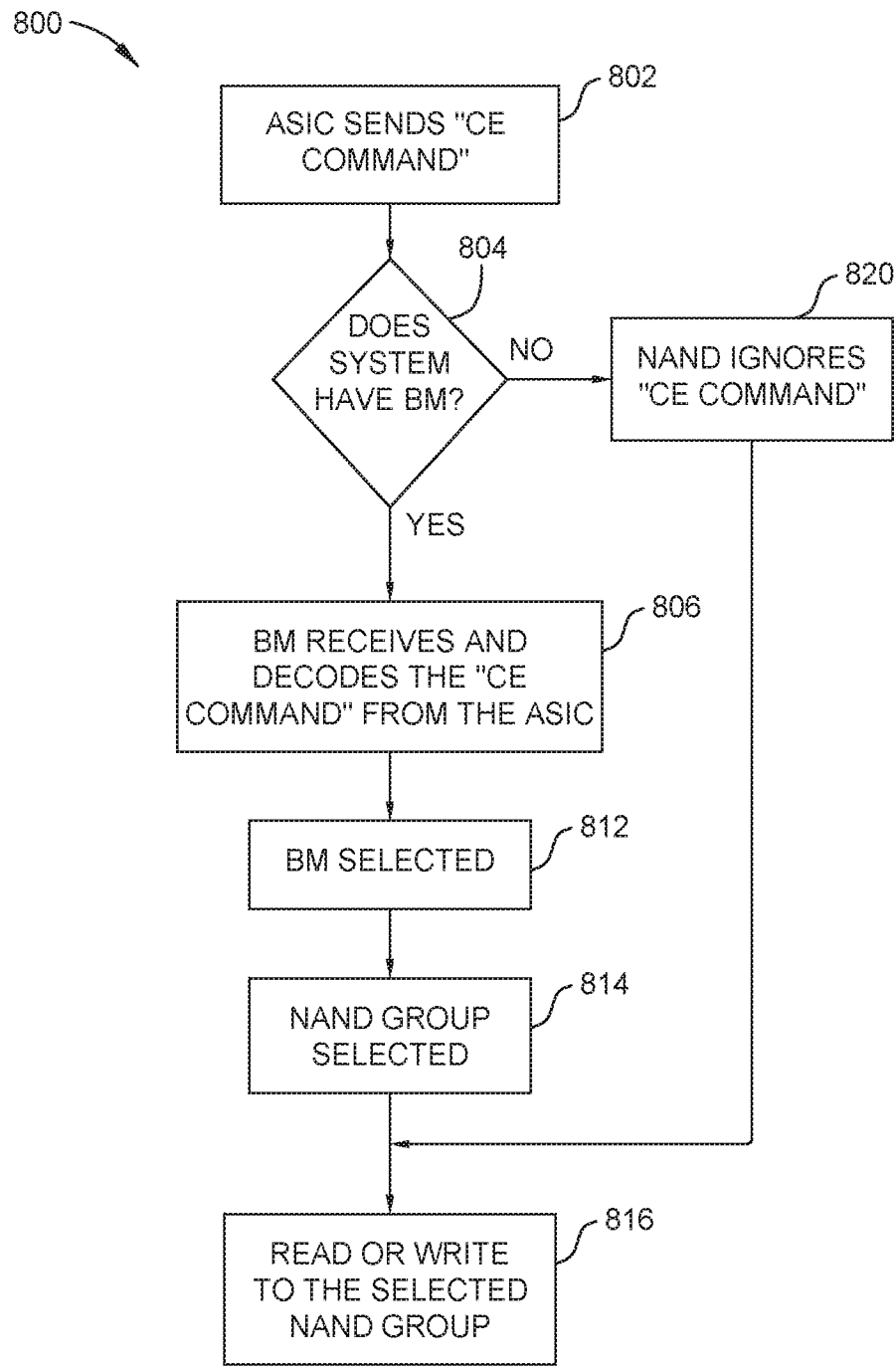
FIG. 8 is a flowchart illustrating a method of operating a device that maximizes FIM capacity.

FIG. 8 is a flowchart illustrating a method 800 of operating a device that maximizes FIM capacity. Method 800 may utilize a controller, such as the controller 108 of the data storage device 106 of FIG. 1, coupled with an ASIC comprised of one or more FIMs coupled to one or more BMs coupled to one or more NAND groups. Aspects of FIG. 4, FIG. 5, FIG. 6, and FIG. 7 may be addressed in method 800. The ASIC sends a CE command signal at block 802. The CE command signal may resemble the CE command signal of FIG. 5, FIG. 6, and/or FIG. 7. After sending the CE command, the controller 108 determines if the data storage device 106 comprises BM in the memory architecture at block 804.

If the data storage device 106 does not have BM capabilities at block 804, then at block 820, the NAND, such as the NVM 110 of FIG. 1, ignores the CE command. The read or write command associated with the CE command is executed on the relevant or selected NAND group at block 816.

However, if the data storage device 106 does have BM capabilities at block 804, then at block 806, the BM receives the CE command from the ASIC. The CE command is decoded at block 806 and the relevant BM is selected at block 812. The relevant BM is selected based on the significant section of the CE command signal, as illustrated in FIG. 6 and FIG. 7. The BM address may be the "7" of the code word "71h" of FIG. 5. The "7" refers to the eighth BM, which is the "BUS mux 7" of FIG. 5.

After the BM is selected at block 812, the relevant NAND group is selected at block 814. Like the selection of the BM, the NAND group is selected based on the significant section of the CE command signal that corresponds to the NAND group selection, as illustrated in FIG. 6 and FIG. 7. For example, the NAND address may be the NAND group whose location may be denoted by the "1" of the code word "71h" of FIG. 5. The "1" refers to the second NAND group, which is the "NAND GR1" of FIG. 5. After both the BM address is selected at block 812 and the NAND address is selected at block 814, the read or write command is executed on the relevant NAND location at block 816.

By addressing individual bus multiplexers can be addressed by a chip enable (CE) command that identifies the specific bus multiplexer as well as the specific memory device of the specific bus multiplexer, more dies per channel can be used without creating SI or limiting transmission performance.

In one embodiment, a data storage device comprises: a plurality of memory devices; a plurality of bus multiplexers, wherein each bus multiplexer is coupled to one or more memory devices of the plurality of memory devices; and a flash interface module coupled to the plurality of bus multiplexers; and a controller coupled to the flash interface module, wherein the controller is configured to: send a chip enable command through the flash interface controller, wherein the chip enable command includes a bus multiplexer identifier and a memory device identifier. Each bus multiplexer is configured to ignore a chip enabled command directed to a different bus multiplexer. Each bus multiplexer is configured to direct a chip enabled command for to a specific memory device coupled thereto. The controller is configured to send the chip enable command as part of a larger command that includes a read or write command. The chip enable command comprises 8 bits. The larger command includes a prefix portion, and wherein the chip enable command is within the larger command between the prefix portion and the read or write command. The flash interface module is a first flash interface module, wherein the data storage device includes a plurality of flash interface modules, and wherein each flash interface module of the plurality of flash interface modules is coupled to a plurality of bus multiplexers. The chip enable command is sent with a bus multiplexer signal and a memory device signal.

In another embodiment, a data storage device comprises: a controller; a plurality of flash interface modules coupled to the controller; a plurality of bus multiplexers coupled to at least a first flash interface module of the plurality of flash interface modules; and a plurality of memory devices coupled to a first bus multiplexer of the plurality of bus multiplexers, wherein the controller is configured to: send a first signal to the first flash interface module; send a second signal to the first flash interface module, wherein the second signal is lower than the first flash signal; and send a command signal to the first flash interface module, wherein the first signal, second signal, and command signals are distinct. The first signal identifies the first bus multiplexer. The second signal identifies the first memory device. The plurality of bus multiplexers are connected in parallel to the first flash interface module. The plurality of bus multiplexers are connected in series to the first flash interface module. The plurality of bus multiplexers other than the first bus multiplexer are configured to ignore the first signal, the second signal, and the command signal. Each bus multiplexer has a unique ID number that is static or given upon discovery by the controller.

In another embodiment, a data storage device comprises: a plurality of memory devices; a plurality of bus multiplexers, wherein each bus multiplexer is coupled to at least one memory device of the plurality of memory devices; a flash interface module coupled to the plurality of bus multiplexers; and means to deliver a chip enable command signal to a first memory device of the plurality of memory devices, wherein the chip enable command signal includes a bus multiplexer identifier and a memory device identifier. The data storage device further comprises means to deliver two distinct signals to the flash interface module. The two distinct signals are different voltages. The flash interface module further comprises means to ignore the chip enable command. The data storage device further comprises means to permit the chip enable command to pass through a bus multiplexer of the plurality of bus multiplexers.

While the foregoing is directed to embodiments of the present disclosure, other and further embodiments of the disclosure may be devised without departing from the basic scope thereof, and the scope thereof is determined by the claims that follow.

What is claimed is:
1. A data storage device, comprising:
a plurality of memory devices;
a plurality of bus multiplexers, wherein each bus multiplexer is coupled to one or more memory devices of the plurality of memory devices;
a flash interface module coupled to the plurality of bus multiplexers; and
a controller coupled to the flash interface module, wherein the controller is configured to:
send a chip enable command through the flash interface module, wherein:

the chip enable command includes a bus multiplexer identifier and a memory device identifier;

the chip enable command comprises a ASIC_CE signal, a ASIC_CLE signal, and a ASIC_ALE signal for identifying a bus multiplexer of the plurality of bus multiplexers and a memory device of the plurality of memory devices;

the ASIC_CE signal has a high portion and a low portion;

the ASIC_ALE signal has a high portion and a low portion;

the ASIC_CLE signal has a high portion and a low portion;

the ASIC_ALE signal is the low portion when the ASIC_CE signal is the low portion and the ASIC_CLE signal is the high portion when identifying the bus multiplexer of the plurality of bus multiplexers and the memory device of the plurality of memory devices; and the chip enable command is within a larger command, wherein:

the larger command comprises a prefix portion and either a read command or a write command; and the chip enable command is between the prefix portion and the read or write command.

2. The data storage device of claim 1, wherein each bus multiplexer is configured to ignore a chip enabled command directed to a different bus multiplexer.

3. The data storage device of claim 1, wherein each bus multiplexer is configured to direct a chip enabled command to a specific memory device coupled thereto.

4. The data storage device of claim 1, wherein the controller is configured to send the chip enable command as part of the larger command that includes the read or the write command.

5. The data storage device of claim 4, wherein the chip enable command comprises 8 bits.

6. The data storage device of claim 1, wherein the flash interface module is a first flash interface module, wherein the data storage device includes a plurality of flash interface modules, and wherein each flash interface module of the plurality of flash interface modules is coupled to the plurality of bus multiplexers.

7. The data storage device of claim 1, wherein the chip enable command is sent with a bus multiplexer signal and a memory device signal.

8. A data storage device, comprising:

a controller;

a plurality of flash interface modules coupled to the controller;

a plurality of bus multiplexers coupled to at least a first flash interface module of the plurality of flash interface modules; and a plurality of memory devices coupled to a first bus multiplexer of the plurality of bus multiplexers, wherein the controller is configured to:

send a chip enable command to the first flash interface, wherein sending the chip enable command comprises:

sending a first signal to the first flash interface module; and sending a second signal to the first flash interface module, wherein the second signal is received after the first signal, and wherein the first signal identifies a bus multiplexer of the plurality of bus multiplexers and the second signal identifies a memory device of the plurality of memory devices; and send a command signal to the first flash interface module, wherein:

the first signal, second signal, and command signals are distinct, the chip enable command comprises a ASIC_CE signal, a ASIC_CLE signal, and a ASIC_ALE signal for identifying a bus multiplexer of the plurality of bus multiplexers and a memory device of the plurality of memory devices, the ASIC_CE signal has a high portion and a low portion, the ASIC_ALE signal has a high portion and a low portion, the ASIC_CLE signal has a high portion and a low portion, the ASIC_ALE signal is the low portion when the ASIC_CE signal is the low portion and the ASIC_CLE signal is the high portion when identifying the bus multiplexer of the plurality of bus multiplexers and the memory device of the plurality of memory devices; and the chip enable command is within a larger command, wherein:

the larger command comprises a prefix portion and the command signal; and the chip enable command is between the prefix portion and the command signal.

9. The data storage device of claim 8, wherein the high portion of the ASIC_CE signal identifies the first bus multiplexer.

10. The data storage device of claim 9, wherein the low portion of the ASIC_CE signal identifies the first memory device.

11. The data storage device of claim 8, wherein the plurality of bus multiplexers are connected in parallel to the first flash interface module.

12. The data storage device of claim 8, wherein the plurality of bus multiplexers are connected in series to the first flash interface module.

13. The data storage device of claim 12, wherein the plurality of bus multiplexers other than the first bus multiplexer are configured to ignore the high portion of the ASIC_CE signal, the low portion of the ASIC_CE signal, and the command signal.

14. The data storage device of claim 8, wherein each bus multiplexer has a unique ID number that is static or given upon discovery by the controller.

15. A data storage device, comprising:

a plurality of memory devices;

a plurality of bus multiplexers, wherein each bus multiplexer is coupled to at least one memory device of the plurality of memory devices;

a flash interface module coupled to the plurality of bus multiplexers; and means to deliver a chip enable command signal to a first memory device of the plurality of memory devices, wherein:

the chip enable command comprises a ASIC_CE signal, a ASIC_CLE signal, and a ASIC_ALE signal corresponding to a bus multiplexer of the plurality of bus multiplexers and a memory device of the plurality of memory devices;

the ASIC_CE signal has a high portion and a low portion; the ASIC_ALE signal has a high portion and a low portion; the ASIC_CLE signal has a high portion and a low portion; the ASIC_ALE signal is the low portion when the ASIC_CE signal is the low portion and the ASIC_CLE signal is the high portion when identifying the bus multiplexer of the plurality of bus multiplexers and the memory device of the plurality of memory devices; and the chip enable command is within a larger command, wherein:

the larger command comprises a prefix portion and either a read command or a write command; and the chip enable command is between the prefix portion and the read or write command.

16. The data storage device of claim 15, further comprising means to deliver two distinct signals to the flash interface module.

17. The data storage device of claim 16, wherein the two distinct signals are different voltages.

18. The data storage device of claim 15, wherein the flash interface module further comprises means to ignore the chip enable command.

19. The data storage device of claim 15, further comprising means to permit the chip enable command to pass through the bus multiplexer of the plurality of bus multiplexers.

* * * * *